(12) United States Patent
Bourzeix et al.

(10) Patent No.: US 6,324,193 B1
(45) Date of Patent: Nov. 27, 2001

(54) CONTINUOUSLY WAVELENGTH-TUNABLE MONOMODE LASER SOURCE

(75) Inventors: Sophie Bourzeix, Paris; Daniel Gatti, Le Pecq; Philippe Graindorge, Chevigny St. Sauveur; Bernard Laloux, Villepreux; Hervé Lefevre, Paris; Denis Mangeot, Aulnay S/Mauldre; Philippe Martin, Pontchartrain, all of (FR)

(73) Assignee: Photonetics, Marly Le Roi (FR)

( * ) Notice: Subject to any disclaimer, the term of this patent is extended or adjusted under 35 U.S.C. 154(b) by 0 days.

(21) Appl. No.: 09/252,907

(22) Filed: Feb. 19, 1999

(30) Foreign Application Priority Data

Feb. 20, 1998 (FR) .................................................. 98 02105

(51) Int. Cl.$^7$ ....................................................... H01S 3/10
(52) U.S. Cl. .............................. 372/20; 372/64; 372/32; 372/26; 372/9; 372/102
(58) Field of Search .................. 372/20, 102, 92, 372/32, 29, 98, 99, 107, 64, 26, 109

(56) References Cited

U.S. PATENT DOCUMENTS

| | | | |
|---|---|---|---|
| 5,255,273 | * 10/1993 | Nilsson et al. | 372/20 |
| 5,347,527 | * 9/1994 | Favre et al. | 372/20 |
| 5,493,575 | * 2/1996 | Kitamura | 372/20 |
| 5,594,744 | * 1/1997 | Lefevre et al. | 372/20 |
| 5,802,085 | 9/1998 | Lefevre et al. | 372/20 |
| 5,982,794 | * 11/1999 | Tamura | 372/32 |
| 6,026,100 | * 2/2000 | Maeda | 372/20 |
| 6,047,008 | * 4/2000 | Funakawa | 372/20 |

FOREIGN PATENT DOCUMENTS

| | | |
|---|---|---|
| 0702438 | 3/1994 | (EP) . |
| 57-99793 | 6/1982 | (JP) . |

OTHER PUBLICATIONS

Favre, F. and LeGuen, D., "82nm of Continuous Tunability for an External Cavity Semiconductor Laser", *Electronic Letters*, vol. 27, No. 2, Jan. 17, 1991, pp. 183–184.

Liu, K. and Littman, M.G., "Novel Geometry for Single–Mode Scanning of Tunable Lasers", *Optics Letters*, vol. 6, No. 3, pp. 117–118, Mar. 1981.

* cited by examiner

*Primary Examiner*—Leon Scott, Jr.
(74) *Attorney, Agent, or Firm*—Arent Fox Kintner Plotkin & Kahn, PLLC

(57) ABSTRACT

The invention relates to an external cavity, continuously tunable monomode laser source, comprising, in a resonant cavity, resonating at the emission wavelength $\lambda e$, a retroreflecting wavelength dispersing device, arranged to produce a selectivity curve with a peak 80 s.

According to the invention, additional fine-control means, enable, from the approximate continuous tunability position, to monitor the deviation $\lambda e$–$\lambda s$ during the variation of the emission wavelength ke while preventing this deviation from reaching one of the limits causing mode hopping.

Such a configuration enables to avoid imperfections usually associated with mechanical adjustment and to guarantee continuity of the wavelength variation and to compensate for the latter as long as its fluctuations remain smaller than approx. $\Delta\lambda e/2$ where $\Delta\lambda e$ is the distance between two successive resonance modes of the cavity.

12 Claims, 7 Drawing Sheets

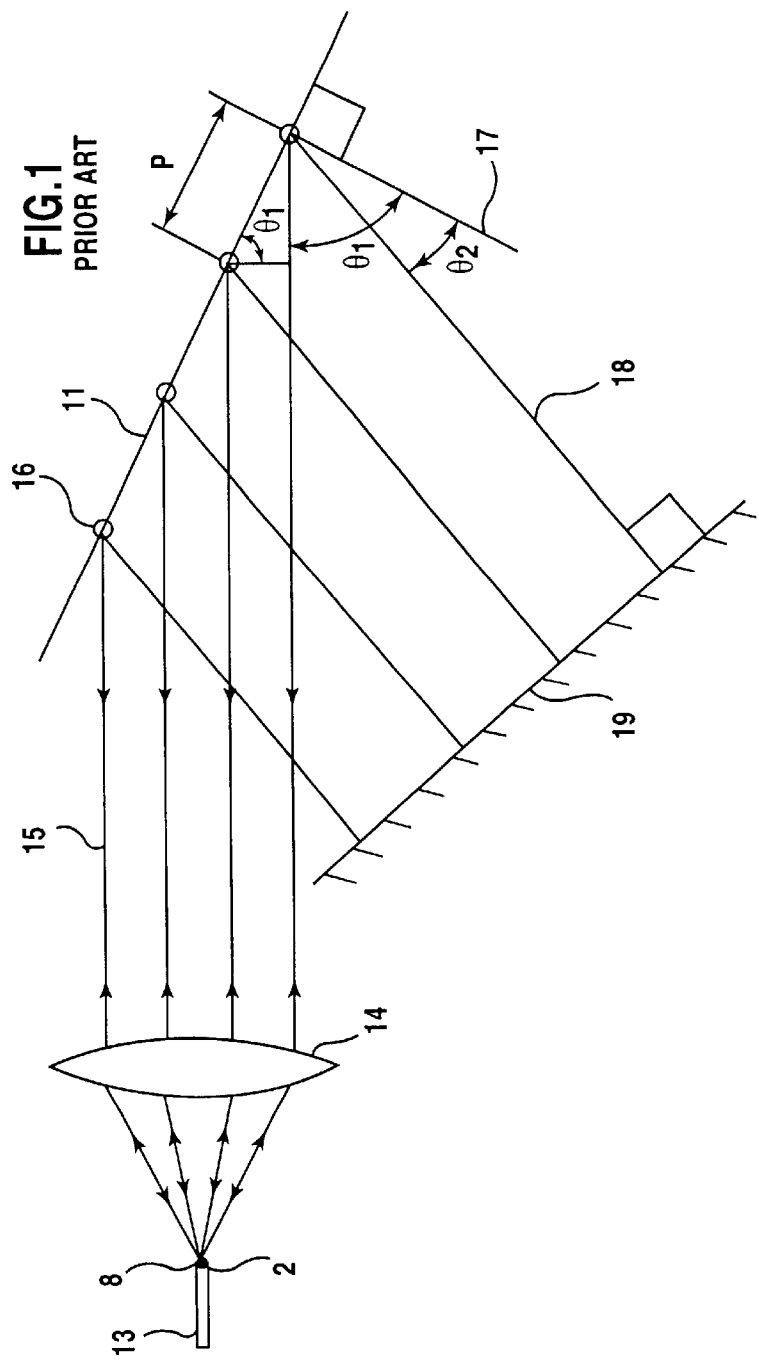
FIG. 1 PRIOR ART
FIG. 2A PRIOR ART
FIG. 2B PRIOR ART

CONTINUOUSLY WAVELENGTH-TUNABLE MONOMODE LASER SOURCE

This invention relates to a wavelength-tunable monomode laser source with external cavity.

We know that the resonant optic cavity of a laser source selects one or several wavelengths emitted by an amplifier laser medium. Most often, the system consists of two mirrors, whereas one of them is partially transparent, forming a so-called Fabry-Perot cavity. Such a Fabry-Perot cavity selects or resonates for semi-wavelengths equal to sub-multiples of the optic length $L_{op}$ of the cavity and hence generally quite close to one another. Several wavelengths can then be amplified by the wide spectrum amplifier medium, to provide a multimode laser.

For certain applications, monomode lasers are preferred. It is then necessary to implement a resonant optic cavity associating a selection means complimentary to the Fabry-Perot cavity, for instance by replacing one of its mirrors by a retroreflecting dispersing device.

Retroreflecting dispersing devices are commonly used in conventional optics. The best known device is probably the pitch p plane grating employed according to the Littrow configuration.

Generally speaking, a pitch p plane grating has a dispersion plane perpendicular to its lines. A collimated light beam of wavelength $\lambda$, tilted by an angle $\theta 1$ with respect to the normal axis of the grating which is parallel to the dispersion plane of the grating, generates a collimated beam which is also parallel to the dispersion plane and whose direction is tilted by an angle $\theta 2$ with respect to the normal axis, whereas $\theta 1$ and $\theta 2$ are linked by the following relation:

$$p \sin \theta 1 + p \sin \theta 2 = \lambda$$

In external cavity tunable laser sources operating with a so-called Littman-Metcalf configuration where the incident collimated beam forms an angle $\theta 1$ with the normal axis of the grating, an additional mirror is placed with its normal axis forming an angle $\theta 2$ on the grating. The wavelength $\lambda$ which respects the equation $\lambda = p \sin \theta 1 + p \sin \theta 2$, is dispersed by the grating at an angle $\theta 2$, then is retroreflected onto the mirror which is then perpendicular, and is finally dispersed again into the grating in return and comes out at the input angle $\theta 1$. This wavelength $\lambda$ is therefore selected in the cavity. Wavelength tunability is obtained by varying the orientation of the grating/mirror assembly, i.e. while varying $\theta 1$, or while varying solely the orientation of the mirror, i.e. while varying $\theta 2$ or finally while varying solely the orientation of the grating, i.e. while varying $\theta 1$ and $\theta 2$, whereby the relation $\theta 1 - \theta 2$ should remain constant.

FIG. 1 represents a grating 11 implemented according to the Littman-Metcalf assembly in which the extremity 2 of a guided monomode amplifier medium 13 is placed at the focus of collimation optics 14 which generate a main collimated beam 15 of wavelength $\lambda$.

This beam is parallel to the dispersion plane of the grating, i.e. to the plane perpendicular to the lines 16 of the grating 11 and forms an angle $\theta 1$ with the normal axis 17 at the surface of the grating 11. By diffraction onto the grating, the beam 15 produces a secondary collimated beam 18, which lies in the dispersion plane and forms an angle $\theta 2$ with the normal axis 17. A plane mirror 19 is placed at right angle to the beam 18 and the beam is retroreflected through the whole system.

We know under these circumstances that, with p as the pitch of the grating, when the relation $p \sin \theta 1 + p \sin \theta 2 = \lambda$ is verified, the beam 15 comes back onto itself after first diffraction onto the grating 11, retroreflection onto the mirror 19 and second diffraction onto the grating 11. It therefore produces a point-image 8 superimposed with the extremity 2.

The adjustment of such devices calls for accurate positioning of the grating round an axis perpendicular to the selection axis and parallel to the dispersion plane. This latter adjustment and its stability are quite difficult and will determine, in most cases, the quality of the result obtained.

For clarification purposes, FIG. 2A represents a view of the focal plane of the collimation optics 14 in which lies the extremity 2 of a guided amplifier medium and the spectrum generated in return by the assemblies shown on FIG. 1, when the amplifier produces a wide spectrum. We have therefore a spectrum ranging from a wavelength $\lambda 1$ to a wavelength $\lambda 2$ and for which the wavelength $\lambda$ is retroreflected onto the extremity 2 and is therefore selected in the cavity.

In practice, since the real rotation axis cannot be exactly parallel to the grating lines, displacement of the spectrum in the focal plane is accompanied by a movement perpendicular to the former and leads, when the wavelength $\lambda'$ is retroreflected, to a configuration such as that represented on FIG. 2B, on which retroreflection is not provided exactly because of the offset of the spectrum, perpendicular to itself, at the same as parallel to itself in the focal plane of the collimation optics.

In the Littman-Metcalf configuration, this problem is raised when the grating 11 or the mirror 19 or both of them, revolve round an axis parallel to the lines 16 of the grating.

Such devices can also generate mode hopping. Indeed, rotation of the grating dispersing device changes the selected wavelength, but this wavelength must also respect the resonance condition of each optic cavity which indicates that the optic length Lop of the cavity (one way) is equal to an integer N of semi-wavelength:

$$L_{op} = N \cdot \lambda/2$$

If the wavelength selected decreases, the cavity must be shortened at the same time, and vice versa when the wavelength increases, in order to keep the same integer N and prevent any mode hopping.

A continuous tunability device exempt from mode hopping has been suggested with a Littrow configuration, distinct from the Littman-Metcalf configuration (F. Favre and D. Le Guen, <<82 nm of continuous tunability for an external cavity semi-conductor laser>>, Electronics Letters, Vol. 27, 183-184, [1991]), but it involves a complex mechanical assembly using two translation movements and two rotation movements.

In an article of 1981, Liu and Littman (Optics Letters, Vol. 6, N°3, March 1981, pp. 117-118) describe a device comprising a mirror and a variable orientation mirror implemented for the execution of a variable wavelength monomode laser. The geometry suggested enables continuous wavelength scanning.

Besides, reflecting dihedra have been studied for a long time. In particular, the Japanese patent application JP-A-57.099793 of Jun. 21, 1981 suggests to use such a dihedron to build a retroreflecting dispersing device in a wavelength multiplexed optic fibre communication system, whereby the said lengths are fixed.

We also know such continuous tunable monomode laser source as described in the European patent application 0.702.438 which uses a Littman-Metcalf configuration defined with reference to FIG. 3 of this title, comprising a plane grating 31, an orthogonal reflecting dihedron 39 whose edge 391 is parallel to the dispersion plane of the grating 31 comprising the collimation axes.

The point A is the point of intersection of the collimation axes and of the grating, the point B' is the optic extremity of the cavity located on dispersing system side, the point C' is the intersection of the main collimation axis with the optic extremity of the cavity located on the amplifier medium side, the point D is the intersection of the plane containing the diffraction phase of the grating and of the parallel to the edge of the dihedron going through B'.

The angle AC'D is kept equal to 90° and the length AD is kept constant.

Such a device in which these conditions are met thanks to purely mechanical means, is satisfactory to a vast extent. However, it has proven useful to further enhance this device in order to facilitate its adjustment.

The purpose of the invention is therefore to provide an external cavity continuously tunable monomode laser source whose ease of adjustment has improved, which could therefore be executed in the best possible economic conditions and guarantee good stability as soon as the first operation and throughout its lifetime.

To this end, the invention relates therefore to an external cavity, continuously tunable monomode laser source. It comprises a resonant cavity, resonating at the emission wavelength $\lambda e$, with:

a spatially monomode, amplifying wave guide, located inside the resonant cavity, whereas the said wave guide exhibits an intracavity face treated with an antireflection coat, collimation optics with a focus, whereby the intracavity face of the wave guide is located at the focus of these optics, a partially reflecting output face, a retroreflecting wavelength dispersing device, arranged with respect to the wave guide and to the collimation optics so that they describe wavelength selectivity curve with a peak $\lambda s$, and primary mechanical means guaranteeing more or less continuous tunability.

According to the invention, it comprises additional fine-control means, enabling from the approximate continuous tunability position, for automatic control of the position of the retroreflecting dispersing device, in order to monitor the deviation $\lambda e - \lambda s$ during the variation of the emission wavelength $\lambda e$ while preventing this deviation from reaching one of the limits causing mode hopping.

Such a configuration enables to avoid imperfections usually associated with mechanical adjustment and to guarantee continuity of the wavelength variation and to compensate for the latter as long as its fluctuations remain smaller than approx. $\Delta\lambda e/2$ where $\lambda\Delta e$ is the distance between two successive resonance modes of the cavity.

Advantageously:

the control means comprise:

a generator of modulation $\lambda e - \lambda s$, an intensity demodulator of the light flux measured which produces a demodulated signal used for automatic control of the position of the retroreflecting dispersing device;

the standard deviation $<\lambda e - \lambda>$ is monitored to a value $\Delta\lambda o$ greater than zero;

the deviation $<\lambda e - \lambda s>$ is monitored to zero;

control and modulation of $\lambda e - \lambda s$ are provided by controlling and modulating the wavelength $\lambda s$ of the peak of the selectivity curve of the retroreflecting dispersing device;

control and modulation of the wavelength $\lambda s$ are provided by additional rotation of one of the elements of the retroreflecting dispersing device;

control and modulation of the wavelength $\lambda s$ are provided by additional rotation of the reflector;

control and modulation of $\lambda e - \lambda s$ are provided by controlling and modulating the wavelength $\lambda e$;

control and modulation of the wavelength $\lambda e$ are provided by additional translation of one of the element of the resonant cavity;

the retroreflecting dispersing device comprises a reflector, whereas control and modulation of the wavelength $\lambda e$ are provided out by additional translation of the said reflector.

The invention will be described in more detail with reference to the drawings on which:

FIG. 1 is a schematic representation of a conventional assembly, of the previous art, according to the Littman-Metcalf configuration;

FIGS. 2A and 2B are a schematic representation of the spectrum reflected in the plane of the source for two different adjustments of the elements of FIG. 1;

Figure 3:
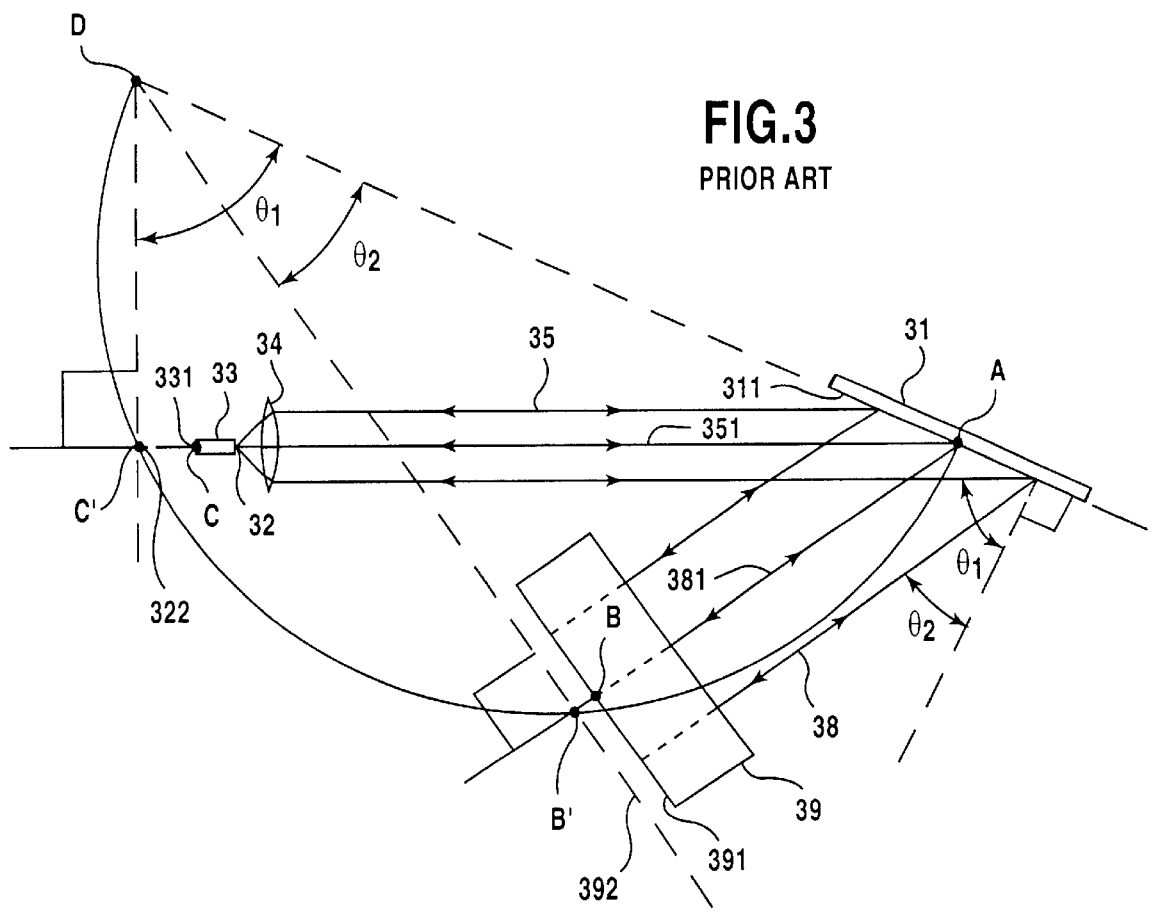
FIG. 3 is a schematic representation of a continuously tunable and self-aligned laser cavity according to the previous art.

In order to improve the operation of an external cavity continuously tunable monomode laser source, such as described above with reference to FIG. 3, the source according to the invention comprises means to control and to modulate the deviation $\lambda e - \lambda s$ when varying the emission wavelength $\lambda e$. These control and modulation means are represented on FIG. 4.

A portion 41 of the light flux 42 emitted by the source 40 is sampled by a separation means 43 and measured by a photoelectric detector 44, providing possibly via a first processing unit 45, a measurement of the deviation $\lambda e - \lambda s$, which, via the control means 47, operates the actuator 49 of the source 40 in order to master this deviation $\lambda e - \lambda s$.

Advantageously, a modulator 48 operates the actuator 49 of the source 40 in order to modulate at a frequency f, the deviation $\lambda e - \lambda s$, whereas the deviation $\lambda e - \lambda s$ then becomes the sum of an average deviation $<\lambda e - \lambda s>$ and of the modulation. In this case, the processing unit 45 contains a demodulator 46 connected to the modulation generator 48 enabling the said unit to extract from the modulated electric signal supplied by the photodetector 44, the demodulated component depending on the deviation $<\lambda e - \lambda s>$.

This demodulated component serves then as an error signal for a slaving loop where control means 47 operate the actuator 49 in order to control the average deviation $<\lambda e - \lambda s>$.

This arrangement, which has proven particularly efficient, seems to apply the following theory. When a purely mechanical adjustment, such as that incorporated to a source of the previous art, represented above with reference to FIG. 3, fulfils the continuous tunability conditions, assuming that the source has been adjusted correctly, the single emission mode has a peak power at the wavelength λe which coincides with the value λs, the peak wavelength of the selectivity curve. This coincidence is maintained when one of the components of the retroreflecting-dispersing device is caused to rotate in order to modify the emission wavelength. The mechanical adjustment is however not perfect and, in practice, the deviation between the wavelengths λe and λs is not kept at zero, it fluctuates. As long as the amplitude of these fluctuations remains within the range from λs−Δλ$_c$/2 to λs+Δλ$_c$/2 (where Δλ$_c$=λ$^2_e$/2L$_{op}$ is the spacing of the longitudinal modes of the cavity), the tunable source continues to operate on the same longitudinal mode without any mode hopping. It has been noticed, however, that if the power of the source is changed by modifying the gain in the amplifier wave guide 33, the said power will modify the index of this guide, thus causing a variation of the optic length L$_{op}$ of the cavity and therefore of λe. Once the mechanical adjustment has been kept constant, the fluctuations of the deviation λe−λs remain identical in amplitude, but are not centred on 0 any longer since they have been translated by the index variation of the wave guide. When these fluctuations cause λe to exceed the limits λs−Δλ$_c$/2 or λs+Δλ$_c$/2, mode hopping can be noticed, which offsets suddenly the emission wavelength λe by Δλ$_c$ or −Δλ$_c$ respectively.

Electromechanical control of the residual deviations λe−λs enables to avoid this mode hopping.

Figure 5:
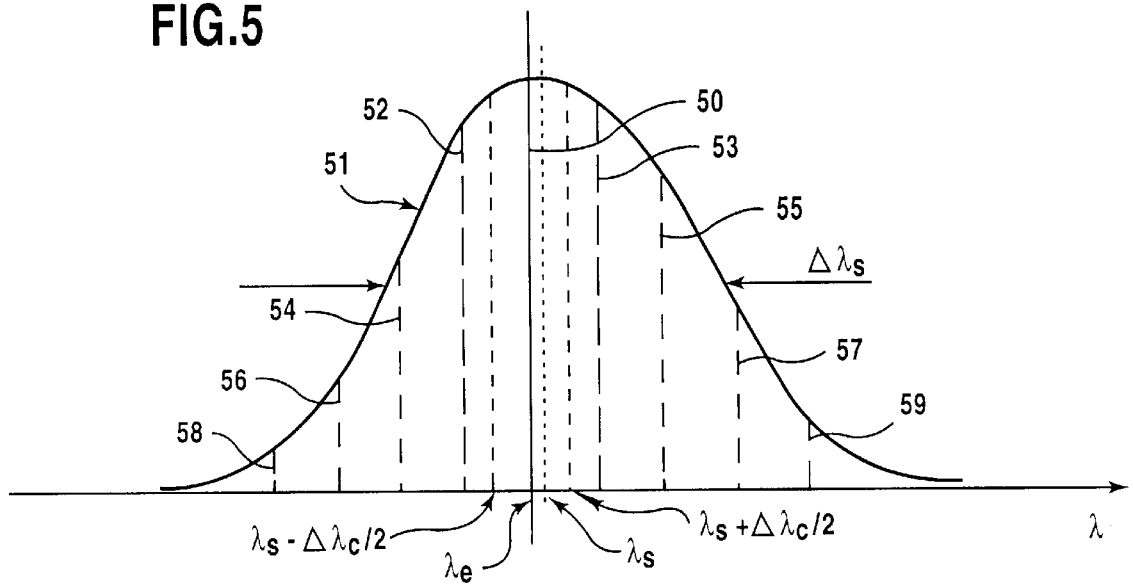
FIG. 5 is a representation of the laser beam emitted by the source with respect to the other longitudinal modes of the Fabry-Perot cavity and to the wavelength selectivity curve of the retroreflecting dispersing device.

FIG. 5 represents the laser beam emitted 50 at the wavelength λe with respect to the wavelength selectivity curve 51 of the retroreflecting dispersing device, a curve centred on the wavelength λs and of width Δλs halfway up, as well as the other longitudinal modes 52 to 59 of the Fabry-Perot cavity.

As long as the absolute value of the deviation λe−λs remains smaller than Δλ$_c$/2, the emission beam 50 coincides with the mode of the Fabry-Perot cavity subject to he highest amplification. When the absolute value of the deviation λe−λs becomes greater than Δλ$_c$/2, one of the longitudinal modes 52, 53 of the Fabry-Perot cavity placed on either side of λe is liable to be exposed to an amplification ratio greater than that of the wavelength λe and may become the emission wavelength to the detriment of the former emission wavelength. There is therefore, failing any control, a mode hopping that should have been avoided by mastering the deviation λe−λs as provided by the invention.

Figure 6:
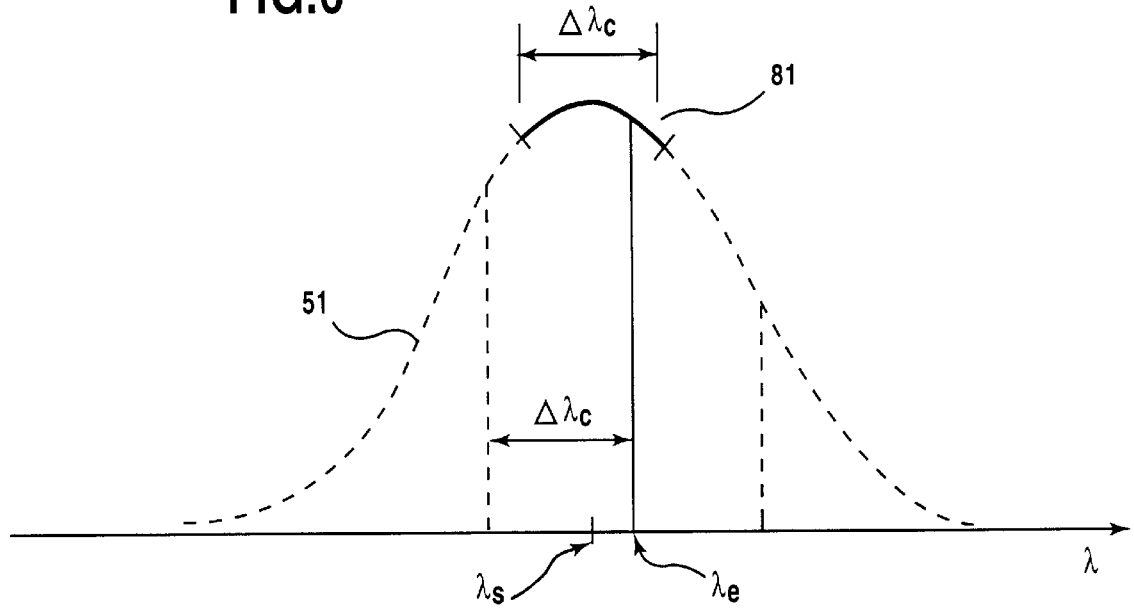
FIG. 6 is a representation of the operating zone of the source without any mode hopping, at the threshold.

Controlling and/or modulating the deviation λe−λs can be carried out by controlling and/or modulating λe or λs. FIG. 6 represents the operating range 81 without any mode hopping. This range 81 centred on λs has a width of Δλc.

Figure 10:
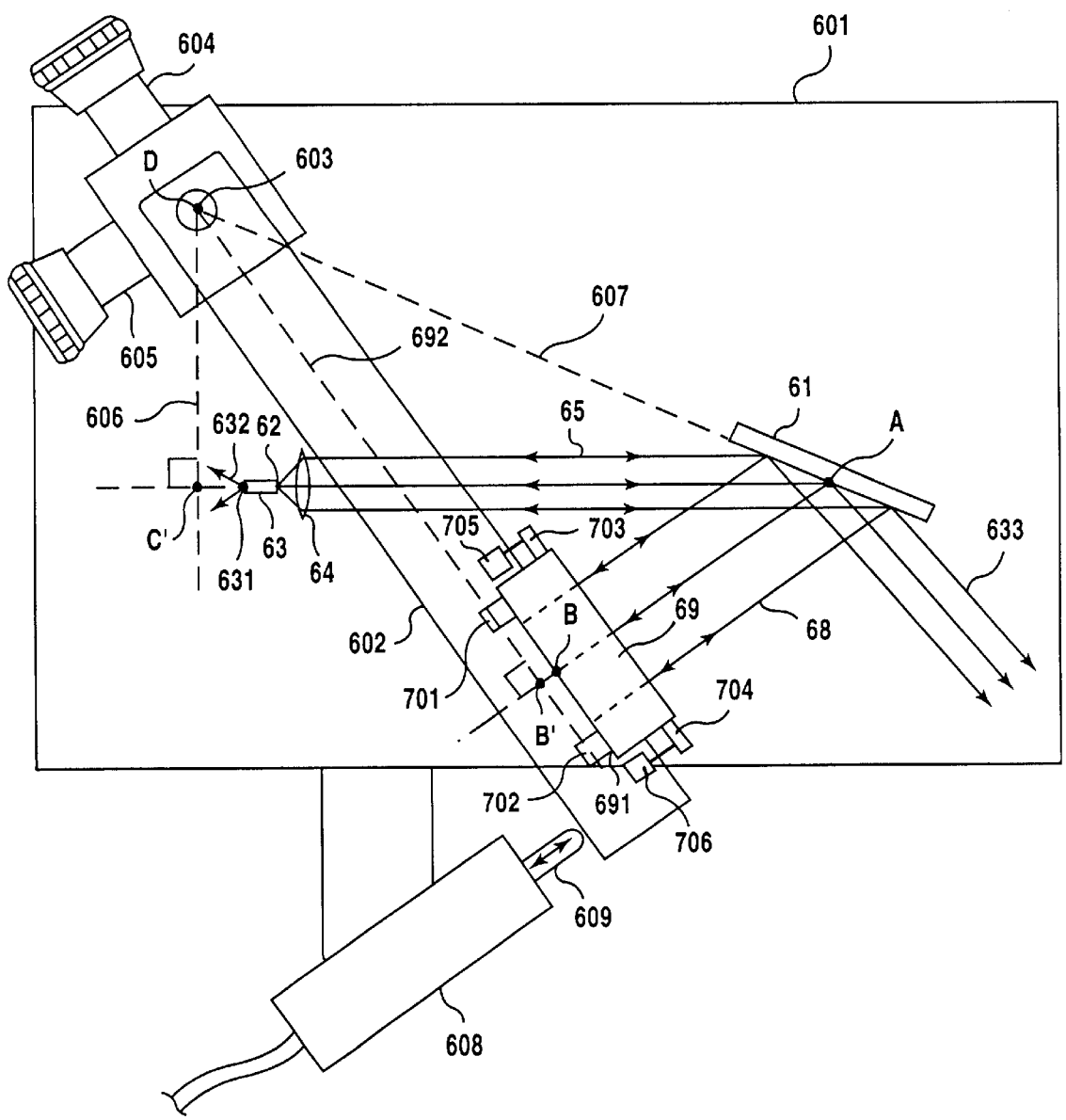
FIG. 10 is a concrete embodiment of the source according to the invention.

The source of the invention is advantageously provided in accordance with FIG. 10 in which the retroreflecting dispersing device comprises a fixed grating 61 and a dihedron 69 mounted on a mobile bracket 602 which can revolve round the axis perpendicular to the dispersion plane of the grating 61 and going through D.

The grating 61, the monomode guided amplifier medium 63 comprising an intracavity face 62, and the collimation lens 64 are fixed on a frame 601. The dihedron 69 is fixed on a primary mobile bracket 602 revolving round an axis 603 moved out of centre, so that the line 692 parallel to the edge 691 going through the point B' which is the optic extremity of the cavity, also goes through the axis 603.

This axis 603 is fixed on a set of translation movements 604 and 605 which enable to position the said axis at the intersection D of the perpendicular 606 to the cavity axis going through C', and of the line 607 going through the face of the grating 61. A motor 608, fixed to the frame 601, actuates a rod 609 which causes the rotation round the axis 603 of the primary bracket 602 and of the dihedron 69 fixed thereon. Thus, the diffracted beam 68 which is selected in the cavity remains perpendicular to the edge 691.

During rotation of the mobile bracket 602, the beam 68 moves laterally on the dihedron 69, as well as B', along the line 692. This displacement of the beam is a geometric translation of the said beam, which does not imply any translations of mechanical parts.

This arrangement enables approximate, purely mechanical, adjustment of the continuous tunability, which is particularly convenient from the point of view of mechanical layout, since it uses simple mechanical rotation of the primary bracket. We observe that the point B' can be offset with respect to the position indicated above, thus shortening or lengthening the cavity. It is then possible to find the same continuous tunability condition by revolving round D while moving the point C' over the same length, but in reverse direction in order to compensate for this offset, offset caused by the displacement of B'.

This tunable source delivers a diverging beam 632 at the output 631 of the amplifier medium 63, but it is also possible to use easily the collimated beam 633 which corresponds to the ordinary reflection of the beam 65 onto the grating 61. This ordinary reflection, also called zero order of the grating, maintains a fixed direction since the grating is fastened to the grating and only the dihedron is mobile during wavelength adjustment.

Controlling and/or modulating the deviation λe−λs is advantageously carried out by controlling and/or modulating λs. This can be provided by acting on the position and/or the additional angular orientation of the reflector 69 round an axis perpendicular to the dispersion plane. To this end, the latter is fixed on the arm 602 via articulated fastening means 701 and 702 and it is interconnected to back-up surfaces 703 and 704 which co-operate with piezoelectric actuators 705 and 706 interconnected to the primary bracket 602. The actuators 705 and 706 can also be simply interposed between the primary bracket 602 and the reflector 69. The primary bracket 602 enables approximate adjustment and the actuators 705 and 706 enable fine-control.

Figure 4:
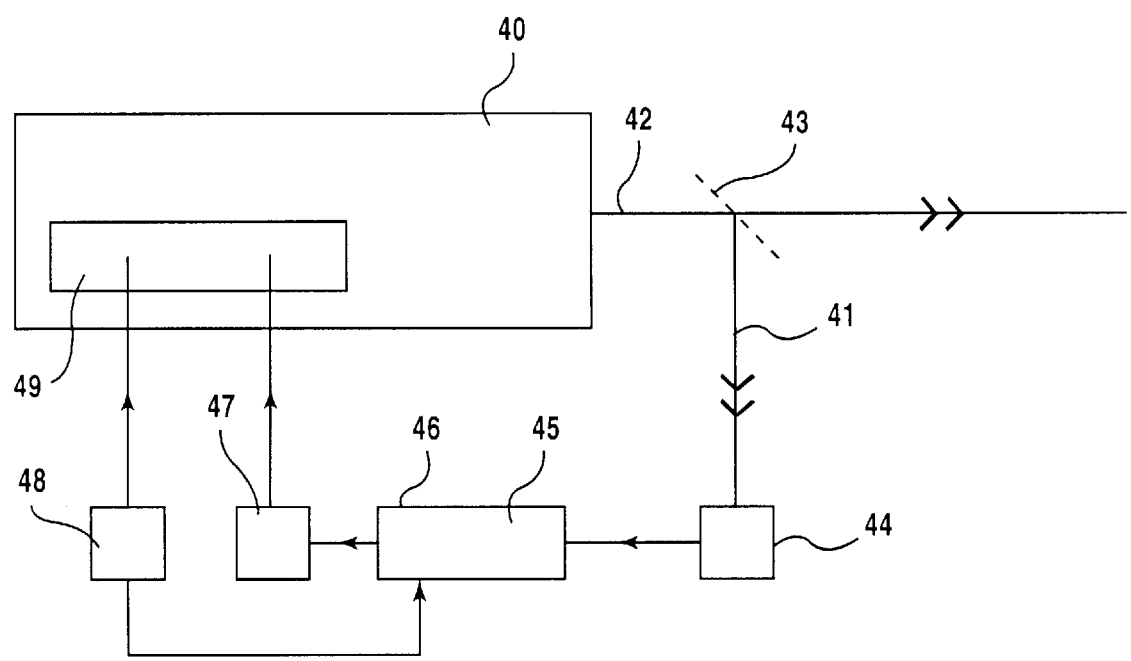
FIG. 4 is a schematic representation of the control and modulation blocks of the source.

These piezoelectric actuators 705, 706, corresponding to the actuator 49 of FIG. 4, are operated by the control means 47 as regards controlling the average deviation <λe−λs > and by the generator 48 as regards its modulation.

In a way similar and not represented, this modulation and/or control of λs can be monitored by acting of the angular orientation of the grating 61.

It is still possible, for controlling and/or modulating the deviation λe−λs, to act on λe, i.e. on the optic length L$_{op}$ of the cavity. Varying the length L$_{op}$ of the cavity can be carried out by translating the reflector 69 or the grating 61. It is also possible to modulate the optic index of an element of the cavity, either of the amplifier guide 63 or of an additional element provided to this end, whose index can be varied in a controlled way. It is thus possible to act on the transversal position parallel to the dispersion plane of the collimation lens 64 with respect to the guided amplifier medium 63 which determines the orientation of the collimated beam 65.

It is often useful to reduce the average deviation <λe−λs> to zero, thereby bringing back the wavelength of the emission mode λe to the peak λs of the selectivity curve of the retroreflecting dispersing device. This produces the maximum optic power. In such a case, the slaving loop is designed so that the demodulated error signal is brought back to zero.

Figure 7:
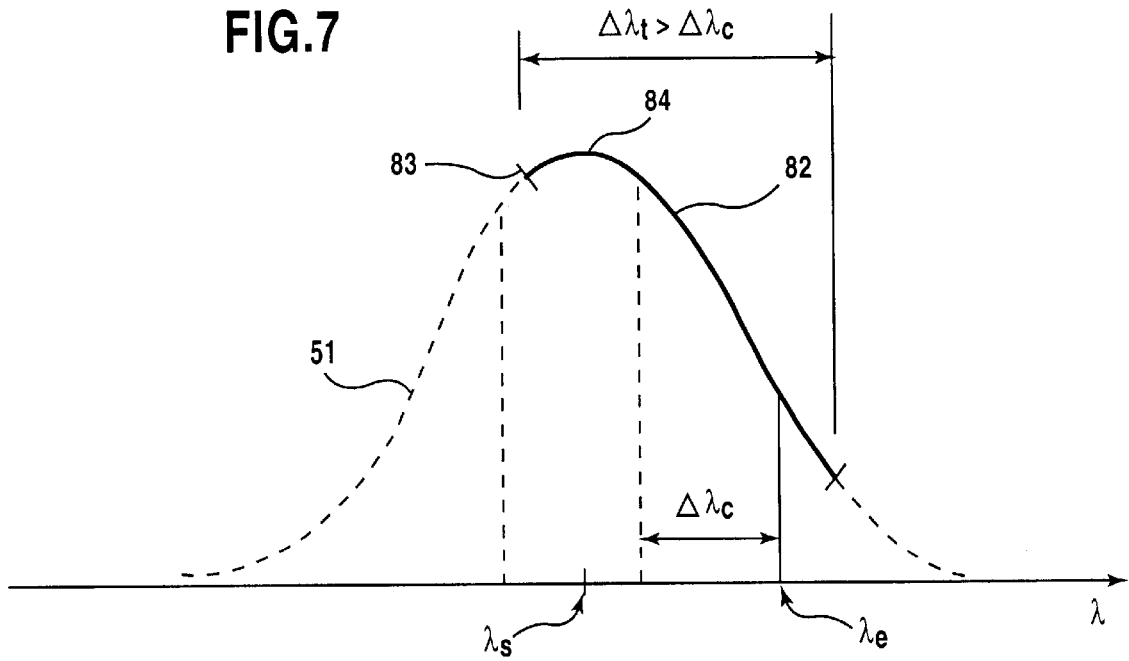
FIG. 7 is a representation of the operating zone of the source without any mode hopping in normal operating conditions.
Figure 8:
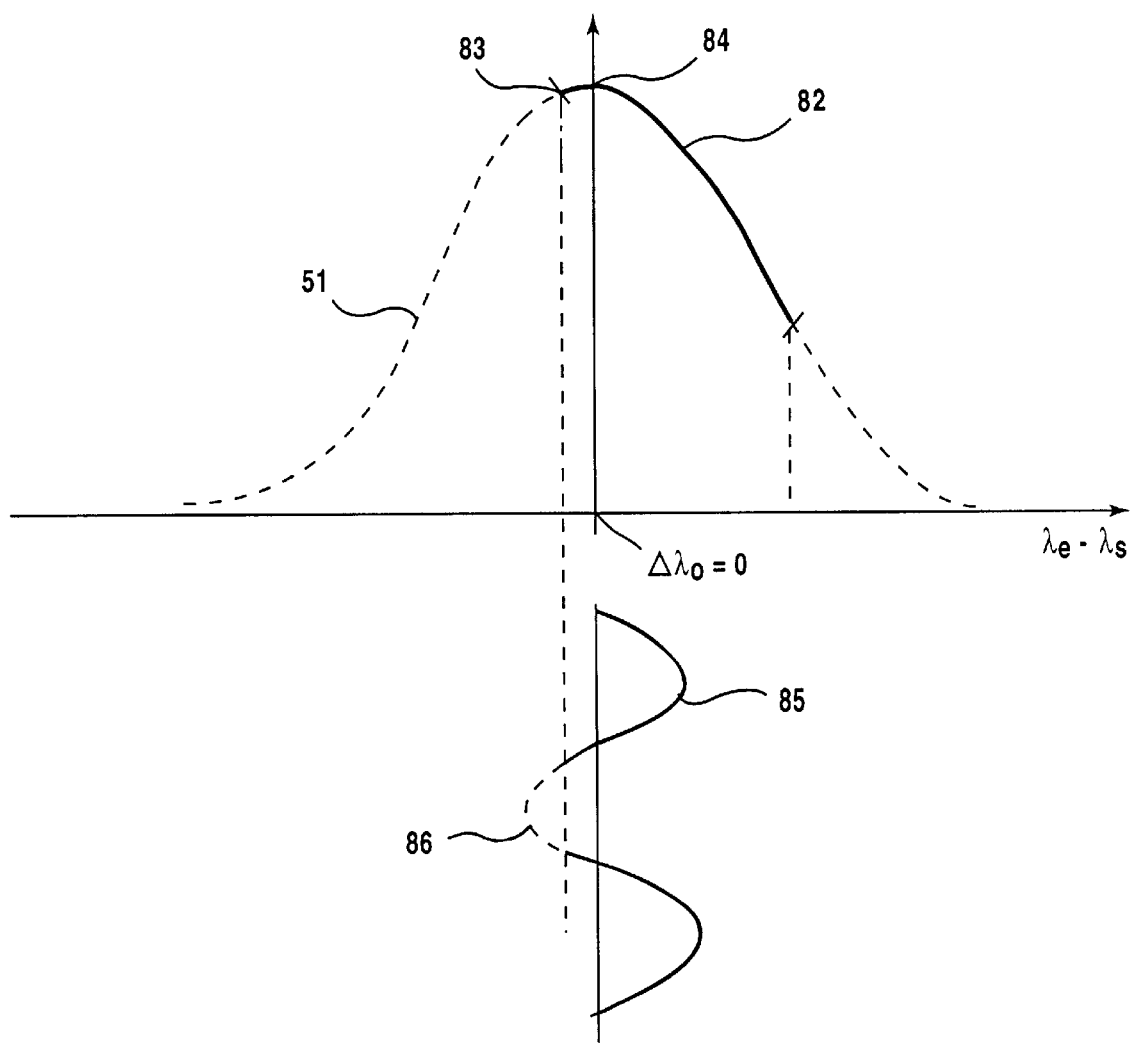
FIGS. 8 and 9 are schematic representations of the modulation used for automatic control.

In practice, it has been noticed that automatic control of the average deviation <$\lambda e-\lambda s$> should preferably be set, not to the zero value, but to a positive value $\Delta\lambda o$ ranging from $\Delta\lambda_c/5$ to $\Delta\lambda_c$. This is what is represented on FIG. 9. Indeed, it has been observed that the explanatory theory of the mode hopping presented above does not correspond to the reality any longer when the operation is far from the laser threshold. In practice, when the power emitted by the source increases, complex phenomena crop up, causing hysteresis and asymmetry effects. The source can then operate without mode hopping over a range of width $\Delta\lambda t$ greater than $\Delta\lambda c$, but it has been detected that this operating range 82 without mode hopping was offset towards the long wavelengths with respect to $\lambda s$ (FIG. 7). Adjustment to the maximum 84 (average deviation <$\lambda e-\lambda s$>=0) then exhibits important risks of mode hopping since the limit 83 towards the smaller wavelengths of these hops is close to $\lambda s$ and small fluctuation of the deviation $\lambda e-\lambda s$, possibly caused by modulation, could cause this frontier to be exceeded and provoke mode hopping (FIG. 8). It is even possible, in the case of very high powers, that this limit 83 towards the smaller wavelengths exceed $\lambda s$.

The value selected for $\Delta\lambda=$<$\lambda e-s$> results from a compromise: $\Delta\lambda o$ must be large enough to keep $\lambda e$ away from the lower limit 83 of the mode hopping, but not too large in order to maintain sufficient power; this power deteriorates when $\lambda e$ moves away from $\lambda s$ which corresponds to the peak 84 of the selectivity curve.

Figure 9:
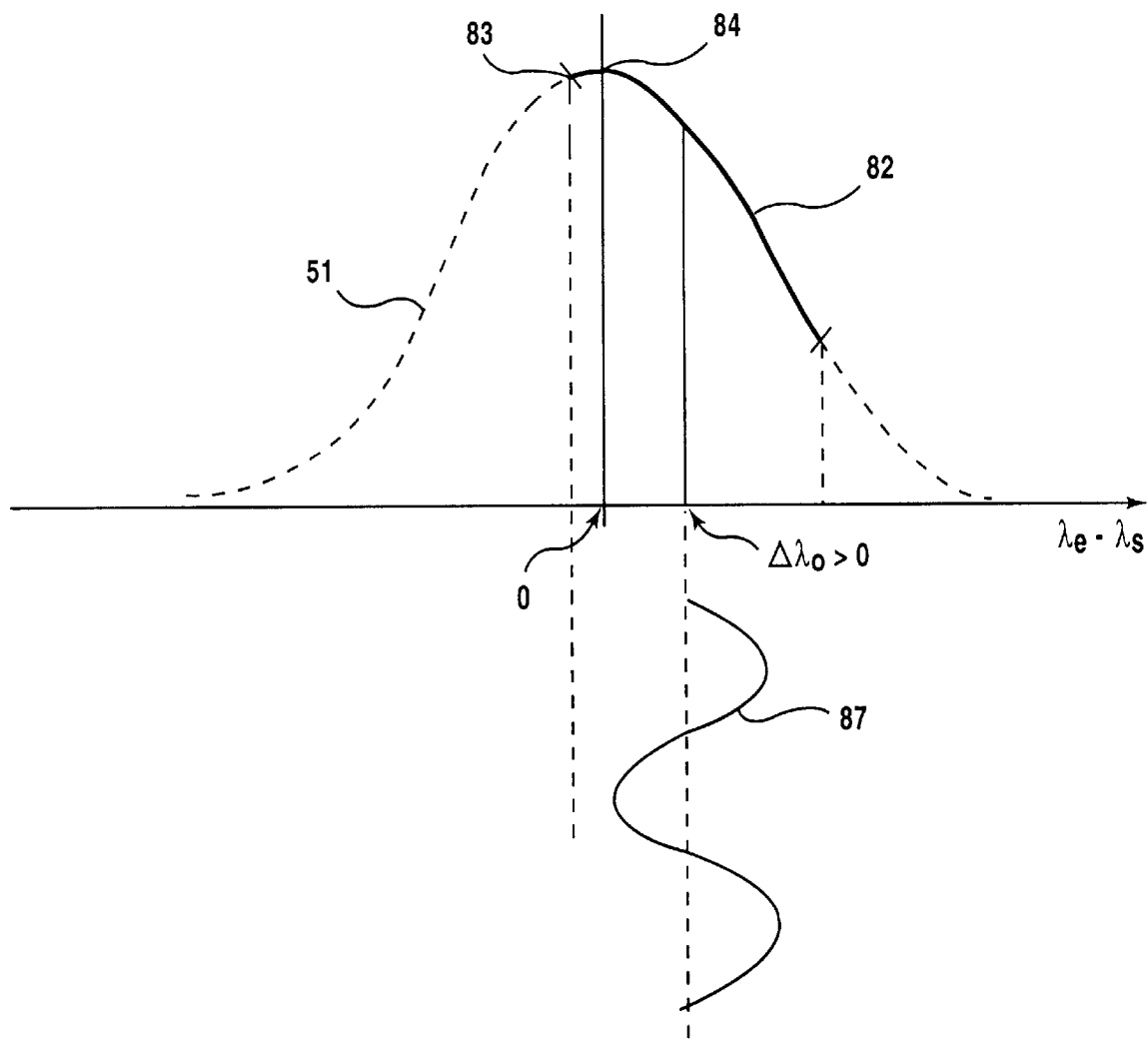

The modulation 85, 87 of the deviation $\lambda e-\lambda s$ is represented on FIGS. 8 and 9. On FIG. 8, $\Delta\lambda=$<$\lambda e-\lambda s$> is equal to 0 and the modulation 85 leads to exceed, in the zone 86, the lower limit 83, which causes mode hopping. On FIG. 9, selection of a value $\Delta\lambda o=$<$\lambda e-\lambda s$> which is positive and sufficient prevents the modulation 87 from exceeding the lower limit 83, without departing too much from the peak 84 of the selectivity curve.

In a particularly interesting embodiment, we seek to provide a source operating round a wavelength of approx. 1550 nm.

The length of the cavity can then be advantageously $L_{op}=30$ mm (30 mm one way only), the distance $\Delta\lambda c$ of the longitudinal modes is approx. 40 pm and the width $\Delta\lambda s$ halfway up of the selectivity curve is approx. 200 pm.

The deviation $\lambda e-\lambda s$ should be controlled and/or modulated by additional rotation of the reflector 69.

The modulation amplitude of the deviation $\lambda e-\lambda s$ is typically 10 pm, i.e. $\Delta\lambda_c/4$ and the modulation frequency ranges from 5 to 10 kHz. Since the reflector dihedron can be very light, such a movement at such a frequency is obtained quite easily with less modulation voltage on conventional piezoelectric ceramics.

For monitoring and automatic controlling $\lambda e-\lambda s$ on $\Delta\lambda o$, which corrects the defects of the primary mechanical system, compensation amplitude is in practice linked with the electric voltage available to drive the actuators. A good order of magnitude consists in compensating for a few $\Delta\lambda_c$ (either a few mode hops) with a few tens of volts.

The reference signs inserted after the technical characteristics mentioned in the claims solely aim at facilitating the understanding of the said claims and do not limit their extent in any way.

What is claimed is:

1. An external cavity, continuously wavelength-tunable monomode laser source comprising a resonant cavity, resonating at an emission wavelength $\lambda e$, with:
   a spatially monomode, amplifying wave guide, located inside the resonant cavity, said wave guide having an intracavity face treated with an antireflection coat,
   collimation optics with a focus, the intracavity face of the wave guide being located at the focus of said optics,
   a partially reflecting output face on said wave guide,
   extraction means for extracting a portion of intracavity flux from said wave guide,
   a retroreflecting wavelength dispersing device, arranged with respect to the wave guide and to the collimation optics to produce a wavelength selectivity curve with a peak power wavelength $\lambda s$,
   primary mechanical means for interrelating said wave guide and said retroreflecting wavelength dispersing device for substantially continuous tunability of said laser source, and
   additional fine-control means, for enabling from an approximate continuous tunability position, monitoring and controlling a deviation $\lambda e-\lambda s$ so that during the variation of the emission wavelength $\lambda e$, the deviation is prevented from reaching at least one of plural limits which would cause mode hopping of said laser source.

2. A continuously wavelength-tunable monomode laser source according to claim 1, wherein the fine-control means controls by acting on at least one of a position, and an orientation of the retroreflecting device.

3. A continuously wavelength-tunable monomode laser source according to claim 2, wherein the fine-control means includes
   a generator of modulation for the deviation $\lambda e-\lambda s$,
   an intensity demodulator of the portion of the intracavity flux extracted by the extraction means and measured, said demodulator producing a demodulated signal, and
   a control means receiving the demodulated signal and performing said acting for control of the position of the retroreflecting dispersing device.

4. A continuously wavelength-tunable monomode laser source according to claim 1, wherein an average deviation is monitored and controlled to a value $\Delta\lambda o$ greater than zero.

5. A continuously wavelength-tunable monomode laser source according to claim 1, wherein the deviation is monitored and controlled to zero.

6. A continuously wavelength-tunable monomode laser source according to claim 1, wherein control and modulation of $\lambda e-\lambda s$ are provided by controlling and modulating the wavelength $\lambda s$ of the peak of the selectivity curve of the retroreflecting dispersing device.

7. A continuously wavelength-tunable monomode laser source according to claim 6, wherein control and modulation of the wavelength $\lambda s$ are provided by rotation of one of plural elements of the retroreflecting dispersing device.

8. A continuously wavelength-tunable monomode laser source according to claim 7, wherein the retroreflecting wavelength dispersing device comprises a reflector and, control and modulation of the peak power wavelength $\lambda s$ are provided by additional rotation of the reflector.

9. A continuously wavelength-tunable monomode laser source according to claim 1, wherein control and modulation of $\lambda e-\lambda s$ are provided by controlling and modulating the emission wavelength $\lambda e$.

10. A continuously wavelength-tunable monomode laser source according to claim 9, wherein control and modulation of the emission wavelength $\lambda e$ are provided by additional translation of one of the elements of the resonant cavity.

11. A continuously wavelength-tunable monomode laser source according to claim 10, wherein the retroreflecting wavelength dispersing device comprises a reflector, whereas control and modulation of the emission wavelength $\lambda e$ are provided by additional translation of the reflector.

12. A continuously wavelength-tunable monomode laser source according to claim 1, wherein control and modulation of $\lambda e-\lambda s$ are obtained by controlling and modulating a transversal position, parallel to the dispersion plane, of the collimation optics.

* * * * *